(12) United States Patent
Kong et al.

(10) Patent No.: US 11,804,795 B2
(45) Date of Patent: Oct. 31, 2023

(54) SAMPLING TRIGGER METHOD, MICROPROCESSOR, MOTOR CONTROLLER, AND ELECTRIC VEHICLE

(71) Applicant: HUAWEI TECHNOLOGIES CO., LTD., Guangdong (CN)

(72) Inventors: Xuejuan Kong, Dongguan (CN); Lixia Zou, Dongguan (CN); Ying Liu, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 86 days.

(21) Appl. No.: 17/495,754

(22) Filed: Oct. 6, 2021

(65) Prior Publication Data

US 2022/0045640 A1 Feb. 10, 2022

Related U.S. Application Data (63) Continuation of application No. PCT/CN2020/093008, filed on May 28, 2020.

(51) Int. Cl.
| | | |
|---|---|---|
| H02P 27/04 | (2016.01) | |
| H02P 23/18 | (2016.01) | |
| H03M 1/46 | (2006.01) | |

(52) U.S. Cl.
CPC .............. *H02P 23/18* (2016.02); *H02P 27/04* (2013.01); *H03M 1/462* (2013.01)

(58) Field of Classification Search
CPC ...... H03M 1/485; H03M 1/462; H03M 1/124; H02P 27/04; H02P 23/18; G01D 5/204;
(Continued)

(56) References Cited

U.S. PATENT DOCUMENTS 5,200,683 A * 4/1993 Taylor .................... G05B 19/33
318/661
5,204,603 A * 4/1993 Taylor ................ G05B 19/4062
318/657
(Continued)

FOREIGN PATENT DOCUMENTS

CN 104527773 A 4/2015
CN 104583043 A 4/2015
(Continued)

OTHER PUBLICATIONS

Aengus Murray et al.,"42.3: Resolver Position Sensing System With Integrated Fault Detection for Automotive Applications",2002 IEEE,total 6 pages.
(Continued)

*Primary Examiner* — Bickey Dhakal
*Assistant Examiner* — Gabriel Agared
(74) *Attorney, Agent, or Firm* — Gregg L. Jansen (57) ABSTRACT

This application relates to a motor controller applied to an electric vehicle, a microprocessor in the motor controller, and a sampling trigger method applied to the microprocessor. The sampling trigger method includes: a signal generation module generates an exciting fundamental wave signal to drive the resolver to work; a signal processing module determines an exciting symbol based on the exciting fundamental wave signal, where the exciting symbol includes alternate high-level signals and low-level signals, and the signal processing module further determines a zero crossing point signal of the exciting fundamental wave signal based on the exciting symbol; and a phase shift processing module performs phase shift processing on the zero crossing point signal to obtain a sampling trigger signal, to trigger the microprocessor to sample the resolver feedback signal. In
(Continued)

this solution, fewer peripheral circuits of a chip are used, thereby improving a product integration degree.

17 Claims, 8 Drawing Sheets

(58) Field of Classification Search
CPC .... G01D 21/00; G01R 25/00; G01R 31/2829; Y02T 10/72
USPC .......................................................... 318/800
See application file for complete search history.

(56) References Cited

U.S. PATENT DOCUMENTS

| | | | | |
|---|---|---|---|---|
| 5,229,697 A | * | 7/1993 | Taylor | G05B 19/33 318/605 |
| 5,323,309 A | * | 6/1994 | Taylor | G05B 19/33 318/563 |
| 5,710,509 A | | 1/1998 | Goto et al. | |
| 8,541,964 B2 | * | 9/2013 | Sakaguchi | H02P 6/34 318/400.39 |
| 2008/0129241 A1 | | 6/2008 | Yu et al. | |
| 2011/0227556 A1 | | 9/2011 | Ivchenko et al. | |
| 2011/0254484 A1 | * | 10/2011 | Dai | H02P 6/26 318/400.13 |
| 2016/0099665 A1 | | 4/2016 | Chen et al. | |
| 2017/0227567 A1 | * | 8/2017 | Son | G06F 3/0673 |
| 2020/0295686 A1 | * | 9/2020 | Tiainen | H02K 19/36 |

FOREIGN PATENT DOCUMENTS

| | | |
|---|---|---|
| CN | 105222814 A | 1/2016 |
| CN | 106998162 A | 8/2017 |
| CN | 107547069 A | 1/2018 |
| CN | 110233588 A | 9/2019 |
| CN | 110794343 A | 2/2020 |
| CN | 110943670 A | 3/2020 |
| CN | 111130561 A | 5/2020 |
| JP | 2013127409 A | 6/2013 |

OTHER PUBLICATIONS

Kan Wang et al.,"Hardware-Based Synchronous Envelope Detection Strategy for Resolver Supplied With External Excitation Generator", IEEE Access, vol. 7, Feb. 27, 2019,total 10 pages.

* cited by examiner

SAMPLING TRIGGER METHOD, MICROPROCESSOR, MOTOR CONTROLLER, AND ELECTRIC VEHICLE

CROSS-REFERENCE TO RELATED APPLICATIONS

This application is a continuation of International Application No. PCT/CN2020/093008, filed on May 28, 2020, the disclosure of which is hereby incorporated by reference in its entirety.

TECHNICAL FIELD

This application relates to the field of in-vehicle chip technologies, and in particular, to a sampling trigger method, a microprocessor, a motor controller, and an electric vehicle.

BACKGROUND

In the field of electric vehicles, electric resolvers (referred to as resolvers) are generally used to test a rotor position and a rotation speed of a motor due to reliable working and strong environment adaptability. The resolver is a sensor that accurately measures an angular position and speed of a rotation component such as a motor through a magnetic coupling effect between a primary winding and two secondary windings. The primary winding and the two orthogonal secondary windings of the resolver are respectively mounted on a rotor and a stator of the motor, and a sine feedback signal and a cosine feedback signal are respectively obtained from the two secondary windings through coupling based on an exciting signal applied to the primary winding. The sine feedback signal and the cosine feedback signal may be collectively referred to as a resolver feedback signal. Angular position and rotation speed information of the rotor of the motor may be obtained after the sine feedback signal and the cosine feedback signal are demodulated and converted.

In a conventional resolver decoding solution, when a resolver feedback signal is sampled and decoded, for example, is sampled by using a successive approximation register analog to digital converter (Successive Approximation Register Analog to Digital Converter, SAR-ADC), an exciting signal needs to be shaped by using an additional shaping circuit and then a shaped signal needs to be sent to a microprocessor, to trigger the SAR-ADC to start sampling. However, in this solution, because the additional circuit needs to be configured, an area of a circuit board needs to be occupied, which is not conducive to product integration.

SUMMARY

Embodiments of this application provide a motor controller applied to an electric vehicle, a microprocessor in the motor controller, and a sampling trigger method applied to an SAR-ADC in the microprocessor, to trigger sampling on the microprocessor without using an external shaping circuit, and sample a resolver feedback signal. In this solution, fewer peripheral circuits of a chip can be used, thereby saving an area of a printed circuit board and improving a product integration degree.

According to a first aspect, an embodiment of this application discloses a sampling trigger method, applied to a microprocessor. The microprocessor is connected to a drive motor by using a resolver, and is configured to sample a resolver feedback signal output by the resolver, to detect an electrical angle of the drive motor. The sampling trigger method includes: generating an exciting fundamental wave signal to drive the resolver to work; determining an exciting symbol based on the exciting fundamental wave signal, where the exciting symbol includes alternate high-level signals and low-level signals; determining a zero crossing point signal of the exciting fundamental wave signal based on the exciting symbol; and performing phase shift processing on the zero crossing point signal to obtain a sampling trigger signal, to trigger the microprocessor to sample the resolver feedback signal.

In the technical solution of the first aspect, the exciting symbol is determined based on the exciting fundamental wave signal generated in the microprocessor, then the zero crossing point signal of the exciting fundamental wave signal is determined based on the exciting symbol, and finally phase shift processing is performed on the zero crossing point signal to obtain the sampling trigger signal, to trigger the microprocessor to sample the resolver feedback signal, without using an external sampling circuit, thereby saving an area of a printed circuit board and improving an integration degree.

According to the first aspect, in a possible implementation, to ensure system sampling accuracy, the microprocessor includes a successive approximation register analog to digital converter SAR-ADC with relatively high sampling accuracy; and the triggering the microprocessor to sample the resolver feedback signal includes: triggering the SAR-ADC to sample the resolver feedback signal. In addition, the SAR-ADC further has features such as ease of use and low power consumption, which can reduce system power consumption while facilitating integration.

According to the first aspect, in a possible implementation, the high-level signal corresponds to a part that is of the exciting fundamental wave signal and whose voltage is greater than a reference threshold voltage, the low-level signal corresponds to a part that is of the exciting fundamental wave signal and whose voltage is less than the reference threshold voltage, and a rising edge or a falling edge of the exciting symbol corresponds to a part that is of the exciting fundamental wave signal and whose voltage is equal to the reference threshold voltage. The reference threshold voltage is a direct current component between 0 V and 5 V. In this way, a correspondence between the rising edge or the falling edge of the exciting symbol and a zero crossing point of the exciting fundamental wave signal can be established.

According to the first aspect, in a possible implementation, the determining a zero crossing point signal of the exciting fundamental wave signal based on the exciting symbol includes: determining the zero crossing point signal of the exciting fundamental wave signal based on the rising edge and/or the falling edge of the exciting symbol. In this way, the zero crossing point of the exciting fundamental wave signal can be accurately positioned, to provide a basis for subsequently dodging the zero crossing point of the exciting fundamental wave signal during sampling. In addition, determining the zero crossing point signal based on both the rising edge and the falling edge of the exciting symbol can further improve sampling efficiency and sampling accuracy.

According to the first aspect, in a possible implementation, a phase shift of the sampling trigger signal relative to the zero crossing point signal is greater than a 90° phase shift of the exciting fundamental wave signal from the zero crossing point to a peak point, and the phase shift can be adjusted. In this way, the zero crossing point of the exciting fundamental wave signal can be dodged, thereby avoiding a relatively large calculation error generated because a divisor is close to 0. In addition, the phase shift can be adjusted based on a specific use case, for ease of use by a user.

According to the first aspect, in a possible implementation, an absolute value of a difference between phase shift processing time of the zero crossing point signal and primary reference time is less than a preset threshold, and the primary reference time is time of phase shift of the exciting fundamental wave signal from the zero crossing point to a peak point and delay time of passing through a resolver sampling feedback loop by the exciting fundamental wave signal. In this way, the zero crossing point of the exciting fundamental wave signal can be dodged, to ensure, as far as possible, that sampling is performed near the peak point of the exciting fundamental wave signal, thereby avoiding a relatively large calculation error generated because a divisor is close to 0, and improving sampling accuracy.

According to a first aspect, in a possible implementation, the generating an exciting fundamental wave signal to drive the resolver to work includes: further generating a carrier signal while generating the exciting fundamental wave signal, and comparing the exciting fundamental wave signal with the carrier signal to generate an exciting modulation signal, where an exciting signal is obtained after the exciting modulation signal is filtered and amplified, to drive the resolver to work; and the performing phase shift processing on the zero crossing point signal to obtain a sampling trigger signal includes: performing phase shift processing on the zero crossing point signal to obtain a sampling trigger signal corresponding to a peak and/or a valley of a signal obtained after the exciting signal passes through a resolver sampling feedback loop. In this way, the zero crossing point of the exciting fundamental wave signal can be dodged, to ensure, as far as possible, that sampling is performed near the peak point of the exciting fundamental wave signal, thereby avoiding a relatively large calculation error generated because a divisor is close to 0, and improving sampling accuracy.

According to the first aspect, in a possible implementation, to decode the resolver feedback signal to obtain the electrical angle, after the triggering the microprocessor to sample the resolver feedback signal, the sampling trigger method further includes: calculating the electrical angle of the drive motor based on collected data.

According to a second aspect, an embodiment of this application discloses a microprocessor, connected to a drive motor by using a resolver, and configured to sample a resolver feedback signal output by the resolver, to detect an electrical angle of the drive motor. The microprocessor includes a signal generation module, a signal processing module, and a phase shift processing module. The signal generation module is configured to generate an exciting fundamental wave signal to drive the resolver to work. The signal processing module is configured to determine an exciting symbol based on the exciting fundamental wave signal, where the exciting symbol includes alternate high-level signals and low-level signals, and the signal processing module is further configured to determine a zero crossing point signal of the exciting fundamental wave signal based on the exciting symbol. The phase shift processing module is configured to perform phase shift processing on the zero crossing point signal to obtain a sampling trigger signal, to trigger the microprocessor to sample the resolver feedback signal.

In the technical solution of the second aspect, the microprocessor determines the exciting symbol based on the internally generated exciting fundamental wave signal, then determines the zero crossing point signal of the exciting fundamental wave signal based on the exciting symbol, and finally performs phase shift processing on the zero crossing point signal to obtain the sampling trigger signal, to trigger the microprocessor to sample the resolver feedback signal, without using an external sampling circuit, thereby saving an area of a printed circuit board and improving an integration degree.

According to the second aspect, in a possible implementation, the microprocessor includes a successive approximation register analog to digital converter SAR-ADC; and the phase shift processing module is configured to perform phase shift processing on the zero crossing point signal to obtain the sampling trigger signal, to trigger the SAR-ADC to sample the resolver feedback signal.

According to the second aspect, in a possible implementation, the high-level signal corresponds to a part that is of the exciting fundamental wave signal and whose voltage is greater than a reference threshold voltage, the low-level signal corresponds to a part that is of the exciting fundamental wave signal and whose voltage is less than the reference threshold voltage, and a rising edge or a falling edge of the exciting symbol corresponds to a part that is of the exciting fundamental wave signal and whose voltage is equal to the reference threshold voltage.

According to the second aspect, in a possible implementation, the signal processing module is configured to determine the zero crossing point signal of the exciting fundamental wave signal based on the rising edge and/or the falling edge of the exciting symbol.

According to the second aspect, in a possible implementation, a phase shift of the sampling trigger signal relative to the zero crossing point signal is greater than a 90° phase shift of the exciting fundamental wave signal from a zero crossing point to a peak point, and the phase shift can be set.

According to the second aspect, in a possible implementation, an absolute value of a difference between phase shift processing time of the zero crossing point signal and primary reference time is less than a preset threshold, and the primary reference time is time of phase shift of the exciting fundamental wave signal from a zero crossing point to a peak point and delay time of passing through a resolver sampling feedback loop by the exciting fundamental wave signal.

According to the second aspect, in a possible implementation, the signal generation module is further configured to: generate a carrier signal, and compare the exciting fundamental wave signal with the carrier signal to generate an exciting modulation signal, where an exciting signal is obtained after the exciting modulation signal is filtered and amplified, to drive the resolver to work; and the phase shift processing module is configured to perform phase shift processing on the zero crossing point signal to obtain a sampling trigger signal corresponding to a peak and/or a valley of a signal obtained after the exciting signal passes through a resolver sampling feedback loop.

According to the second aspect, in a possible implementation, the microprocessor further includes a first calculation module, and the first calculation module is configured to calculate an electrical angle of the drive motor based on collected data.

According to a third aspect, an embodiment of this application discloses a motor controller, including an inverter circuit, where an input end of the inverter circuit is connected to a power battery, and an output end of the inverter circuit is connected to a drive motor; the inverter circuit is configured to convert a high-voltage direct current output by the power battery into an alternating current to enable the drive motor to work. The motor controller further includes the microprocessor described in any one of the second aspect and the possible implementations of the second aspect.

According to the third aspect, in a possible implementation, the motor controller further includes a resolver exciting processing circuit and a resolver feedback processing circuit; the resolver exciting processing circuit is electrically connected between the microprocessor and a resolver, and is configured to filter and amplify the exciting modulation signal; and the resolver feedback processing circuit is connected between the resolver and the microprocessor, and is configured to convert the resolver feedback signal into a single-ended signal.

According to the third aspect, in a possible implementation, the motor controller further includes a diagnosis signal sampling circuit; and the diagnosis signal sampling circuit is electrically connected to both the resolver exciting processing circuit and the resolver feedback processing circuit, and is configured to: collect an exciting signal and a resolver feedback signal obtained after processing by the resolver feedback processing circuit, and generate a corresponding loopback detection signal.

The microprocessor further includes a first diagnosis module; and the first diagnosis module is configured to diagnose, based on the loopback detection signal, whether the resolver exciting processing circuit and the resolver feedback processing circuit are faulty.

The microprocessor further includes a second sampling module, a second calculation module, and a second diagnosis module; the second sampling module is configured to sample the resolver feedback signal; and the second calculation module is configured to calculate an electrical angle of the drive motor based on data collected by the second sampling module, where one electrical angle is used for torque control, and the other electrical angle is used for torque monitoring.

The second diagnosis module is configured to diagnose, in real time, data collected by a first sampling module and the second sampling module, and is further configured to diagnose the two electrical angles in real time, so that the electrical angles meet an input quantity requirement of a torque function safety design.

According to a fourth aspect, an embodiment of this application discloses an electric vehicle, including the motor controller described in any one of the third aspect and the possible implementations of the third aspect.

BRIEF DESCRIPTION OF DRAWINGS

To describe the technical solutions in the embodiments of this application or in the background more clearly, the following briefly describes the accompanying drawings needed for describing the embodiments of this application or the background.

DESCRIPTION OF EMBODIMENTS

Embodiments of this application provide an electric vehicle, a motor controller applied to the electric vehicle, a microprocessor in the motor controller, and a sampling trigger method applied to the microprocessor, to trigger sampling on the microprocessor without using an external shaping circuit, and sample a resolver feedback signal. In other words, the microprocessor has a trigger mechanism. In this solution, fewer peripheral circuits of a chip can be used, thereby saving an area of a printed circuit board (PCB, Printed Circuit Board) and improving a product integration degree.

The electric vehicle includes a battery electric vehicle (BEV, Battery Electric Vehicle), a hybrid electric vehicle (HEV, Hybrid Electric Vehicle), and a plug-in hybrid electric vehicle (PHEV, Plug-in Hybrid Electric Vehicle).

The battery electric vehicle includes a motor. An energy source of the motor is a power battery. The power battery of the battery electric vehicle can be recharged from an external power grid. The power battery of the battery electric vehicle is actually a unique source of in-vehicle energy for vehicle propulsion.

The hybrid electric vehicle includes an internal combustion engine and a motor. An energy source of the engine is fuel, and an energy source of the motor is a power battery. The engine is a main source of energy for vehicle propulsion, and the power battery of the hybrid electric vehicle provides supplementary energy for vehicle propulsion (the power battery of the hybrid electric vehicle electrically buffers fuel energy and recovers kinetic energy).

The plug-in hybrid electric vehicle differs from the hybrid electric vehicle in that a power battery of the plug-in hybrid electric vehicle has a larger capacity than the power battery of the hybrid electric vehicle, and the power battery of the plug-in hybrid electric vehicle can be recharged from a power grid. The power battery of the plug-in hybrid electric vehicle is a main source of energy for vehicle propulsion until a loss of the power battery of the plug-in hybrid electric vehicle reaches a low energy level. In this case, the plug-in hybrid electric vehicle operates as the hybrid electric vehicle for vehicle propulsion.

The following describes the embodiments of this application with reference to accompanying drawings. In the embodiments of this application, a structure of an electric vehicle is described by using a battery electric vehicle as an example.

Figure 1:
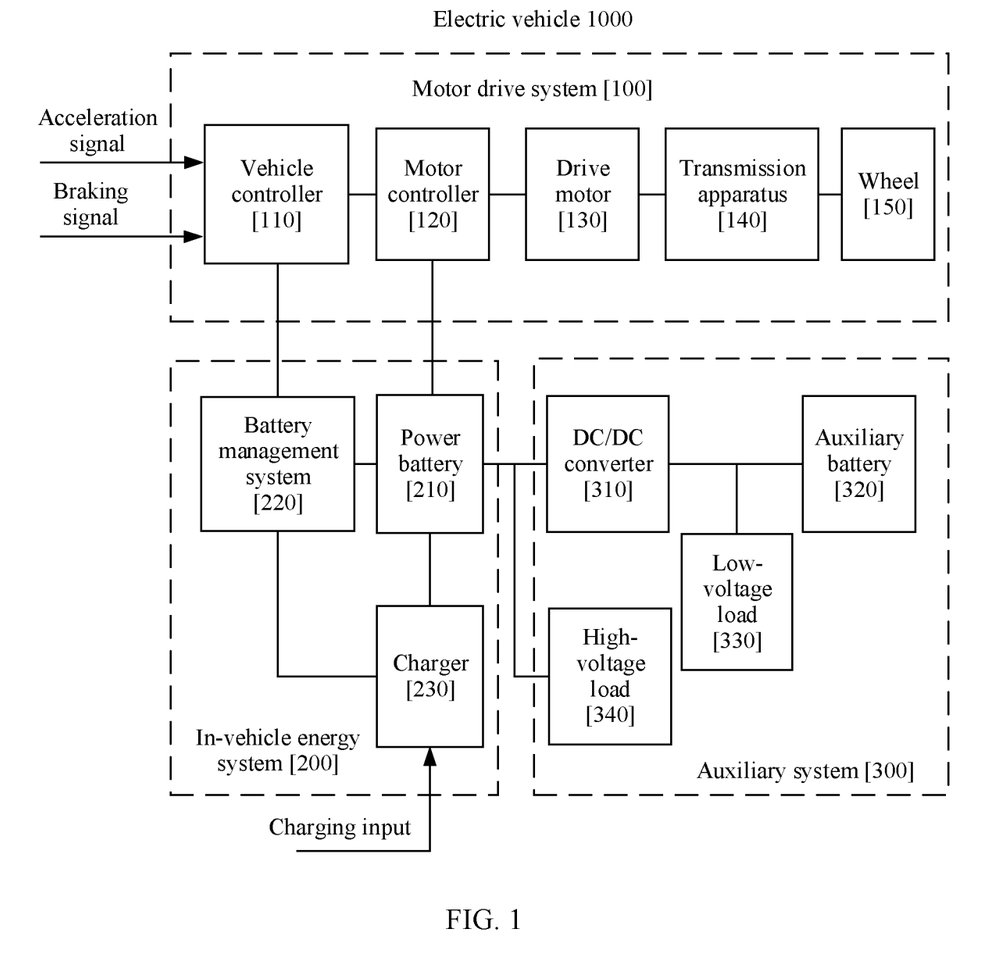
FIG. 1 is a schematic structural diagram of an electric vehicle in an embodiment of this application.

As shown in FIG. 1, an electric vehicle 1000 specifically includes a motor drive system 100 configured to drive the vehicle to travel, an in-vehicle energy system 200 configured to provide energy, and an auxiliary system 300. Specifically, the motor drive system 100 includes a vehicle control unit 110, a motor controller 120, a drive motor 130, a transmission apparatus 140, and a wheel 150. The in-vehicle energy system 200 includes a power battery 210, a battery management system 220, and a charger 230.

The vehicle control unit (VCU) 110 is also referred to as a power assembly controller, is a core control component of the entire vehicle, and is equivalent to a brain of the vehicle. After collecting an accelerator pedal signal, a brake pedal signal, and other component signals and making corresponding determining, the vehicle control unit 110 controls actions of lower-layer component controllers, to drive the vehicle to normally travel. As a command and management center of the vehicle, main functions of the vehicle control unit include drive torque control, brake energy optimization control, vehicle energy management, CAN (Controller Area Network, controller area network) maintenance and management, fault diagnosis and processing, vehicle status monitoring, and the like. The vehicle control unit controls operation of the vehicle. Therefore, performance of the vehicle control unit directly determines stability and safety of the vehicle.

The motor controller 120 is an integrated circuit that actively works to control the drive motor 130 to work based on a specified direction, speed, angle, and response time, and is communicatively connected to the vehicle control unit 110. In the electric vehicle 1000, the motor controller 120 is configured to convert, based on an instruction of a gear, a throttle, a brake, or the like, electric energy stored in the power battery 210 into electric energy needed for the drive motor 130, to control a traveling state such as startup and operation, a forward/backward speed, or a climbing force of the electric vehicle 1000, or help the electric vehicle 1000 brake and store some brake energy in the power battery 210.

The drive motor 130 (commonly referred to as a "motor") is an electromagnetic apparatus that implements electric energy conversion or transmission according to the law of electromagnetic induction, and is electrically connected to the motor controller 120 and mechanically connected to the transmission apparatus 140. The drive motor 130 is mainly configured to generate a drive torque as a power source of the wheel 150. In some embodiments, the drive motor 130 may further convert mechanical energy into electric energy; in other words, may be further used as a generator.

Specifically, the drive motor 130 may be a permanent-magnet synchronous motor (PMSM, Permanent-Magnet Synchronous Motor)-type motor. The drive motor 130 may include a stator and a rotor. The stator includes a stator winding. The rotor may rotate about a central axis relative to the stator. The drive motor 130 may be controlled by enabling a common sine current to flow through the stator winding. An amplitude and a frequency of the current can be changed to control torque and a rotation speed of the rotor. The stator current generates an electromagnetic field, and the electromagnetic field interacts with a permanent magnet used as a component of the rotor. The electromagnetic field enables the rotor to rotate.

For example, the drive motor 130 may be a three-phase motor. That is, the stator winding may include three separate phase windings. To control the drive motor 130, a three-phase voltage wave or a three-phase current wave is applied to the phase windings. The three-phase wave enables signals of all phases to be separated from each other based on a phase difference of 120 degrees.

The transmission apparatus 140 is further mechanically connected to the wheel 150, and is configured to transmit the power source generated by the drive motor 130 to the wheel 150, to drive the electric vehicle 1000 to travel. In some implementations, the transmission apparatus 140 may include a drive shaft (not shown) connected between two wheels 150 and a differential (not shown) disposed on the drive shaft.

The power battery 210 is electrically connected to the motor controller 120, and is configured to store and provide electric energy. The power battery 210 includes but is not limited to a lead-acid battery, a lithium iron phosphate battery, a nickel-hydrogen battery, a nickel-cadmium battery, and the like. In some embodiments, the power battery 210 may alternatively include a supercapacitor.

The battery management system 220 is electrically connected to the power battery 210, and is communicatively connected to the vehicle control unit 110. The battery management system 220 is configured to monitor and estimate states of the power battery 210 in different working conditions, to improve utilization of the power battery 210, and prevent the power battery 210 from being overcharged or over-discharged, thereby prolonging a service life of the power battery 210. Specifically, main functions of the battery management system 220 may include real-time battery physical parameter monitoring, battery status estimation, online diagnosis and warning, charging, discharging, and pre-charging control, balancing management and heat management, and the like.

The charger 230 is electrically connected to the power battery 210, and is configured to be connected to an external power supply to charge the power battery 210. Specifically, when the electric vehicle 1000 is connected to an external power supply (such as a charging pile), the charger 230 converts an alternating current provided by the external power supply into a direct current, to charge the power battery 210. In addition, the battery management system 220 is further connected to the charger 230 to monitor a charging process of the power battery 210.

The auxiliary system 300 includes a DC/DC converter 310, an auxiliary battery 320, a low-voltage load 330, and a high-voltage load 340. One end of the DC/DC converter 310 is connected to the power battery 210, and the other end of the DC/DC converter 310 is connected to both the auxiliary battery 320 and the low-voltage load 330. The DC/DC converter 310 is configured to: after converting a high voltage (such as 380 V) output by the power battery 210 into a low voltage (such as 12 V), charge the auxiliary battery 320 and supply power to the low-voltage load 330. In some implementations, the low-voltage load 330 includes low-voltage vehicle accessories such as a cooling pump, a fan, a heater, a power steering apparatus, and a brake. Certainly, the auxiliary battery 320 may also supply power to the low-voltage load 330. In addition, the power battery 210 is further connected to the high-voltage load 340 to supply power to the high-voltage load 340. In some implementations, the high-voltage load 340 includes a PTC heater, an air conditioning unit, and the like.

It should be noted that electronic modules in the electric vehicle 1000 may communicate with each other by using one or more vehicle networks. The vehicle network may include a plurality of channels for communication. A channel of the vehicle network may be, for example, a serial bus of a controller area network (Controller Area Network, CAN). One of the channels of the vehicle network may include Ethernet defined by the Institute of Electrical and Electronics Engineers (IEEE) 802 standard family. Other channels of the vehicle network may include a discrete connection between modules and may include a power signal from the auxiliary battery 320. Different signals may be transmitted by using different channels of the vehicle network. For example, a video signal may be transmitted by using a high-speed channel (such as Ethernet), and a control signal may be transmitted by using a CAN or a discrete signal. The vehicle network may include any hardware component and software component assisting in signal and data transmission between modules. The vehicle network is not shown in FIG. 1, but it may be implied that the vehicle network may be connected to any electronic module in the electric vehicle 1000. For example, the vehicle network may be connected to the vehicle control unit 110 to coordinate operations of the components.

It may be understood that the schematic structure in this embodiment of this application constitutes no specific limitation on the electric vehicle 1000. In some other embodiments of this application, the electric vehicle 1000 may include more or fewer components than those shown in the figure, combine some components, split some components, or have different component arrangements. The component shown in the figure may be implemented by using hardware, software, or a combination of software and hardware.

The following describes in detail a structure and a corresponding function of the motor controller 120 in this embodiment of this application.

Figure 2:
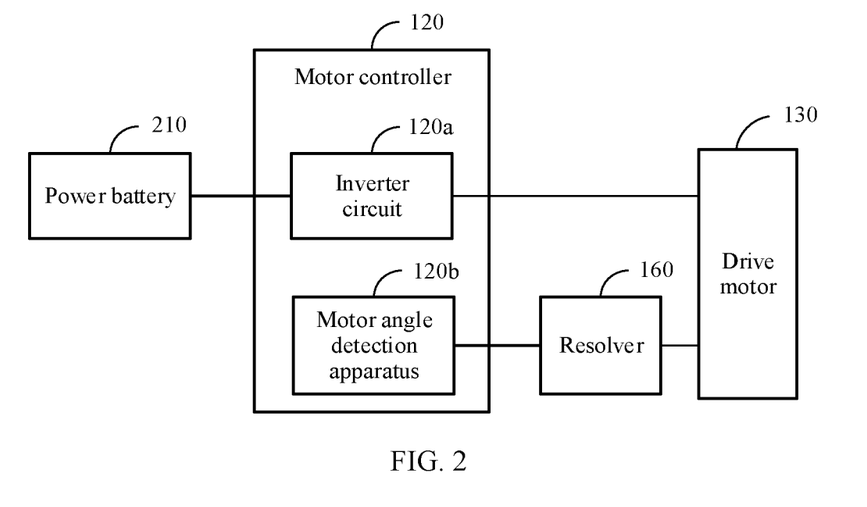
FIG. 2 is a schematic structural and application diagram of a motor controller in FIG. 1.

As shown in FIG. 2, the motor controller 120 includes an inverter circuit 120a and a motor angle detection apparatus 120b. An input end of the inverter circuit 120a is connected to the power battery 210, and an output end of the inverter circuit 120a is connected to the drive motor 130. The inverter circuit 120a is configured to convert a high-voltage direct current output by the power battery 210 into an alternating current (such as a three-phase alternating current), to enable the drive motor 130 to work.

The motor angle detection apparatus 120b is connected to the drive motor 130 by using a resolver (resolver/transformer) 160, to detect an electrical angle of the drive motor 130. The resolver 160 is a sensor that accurately measures an angular position and speed of a rotation component such as a motor through a magnetic coupling effect between a primary winding and two secondary windings. The primary winding and the two orthogonal secondary windings are respectively mounted on a rotor and a stator of the motor, and a sine feedback signal and a cosine feedback signal are respectively obtained from the two secondary windings through coupling based on an exciting signal applied to the primary winding. The sine feedback signal and the cosine feedback signal may be collectively referred to as a resolver feedback signal. Angular position and rotation speed information of the rotor of the motor may be obtained after the sine feedback signal and the cosine feedback signal are demodulated and converted.

A magnetoresistive resolver is usually used in the drive motor 130 of the electric vehicle 1000. The magnetoresistive resolver is a special form of the resolver 160, and implements conversion between electrical signals by using a magnetoresistive principle. A feature of the magnetoresistive resolver is that a primary-side winding and a secondary-side winding are both placed in different slots of the stator of the motor and are both fixed and not rotated. The primary-side winding means that a sinusoidal exciting current flows into an exciting winding, and the secondary-side winding means that an output signal is generated by using a two-phase coil.

It may be understood that the schematic structure in this embodiment of this application constitutes no specific limitation on the motor controller 120. In some other embodiments of this application, the motor controller 120 may include more components than those shown in the figure, such as an auxiliary power supply circuit, a charging circuit, and a voltage/current detection circuit.

Figure 3:
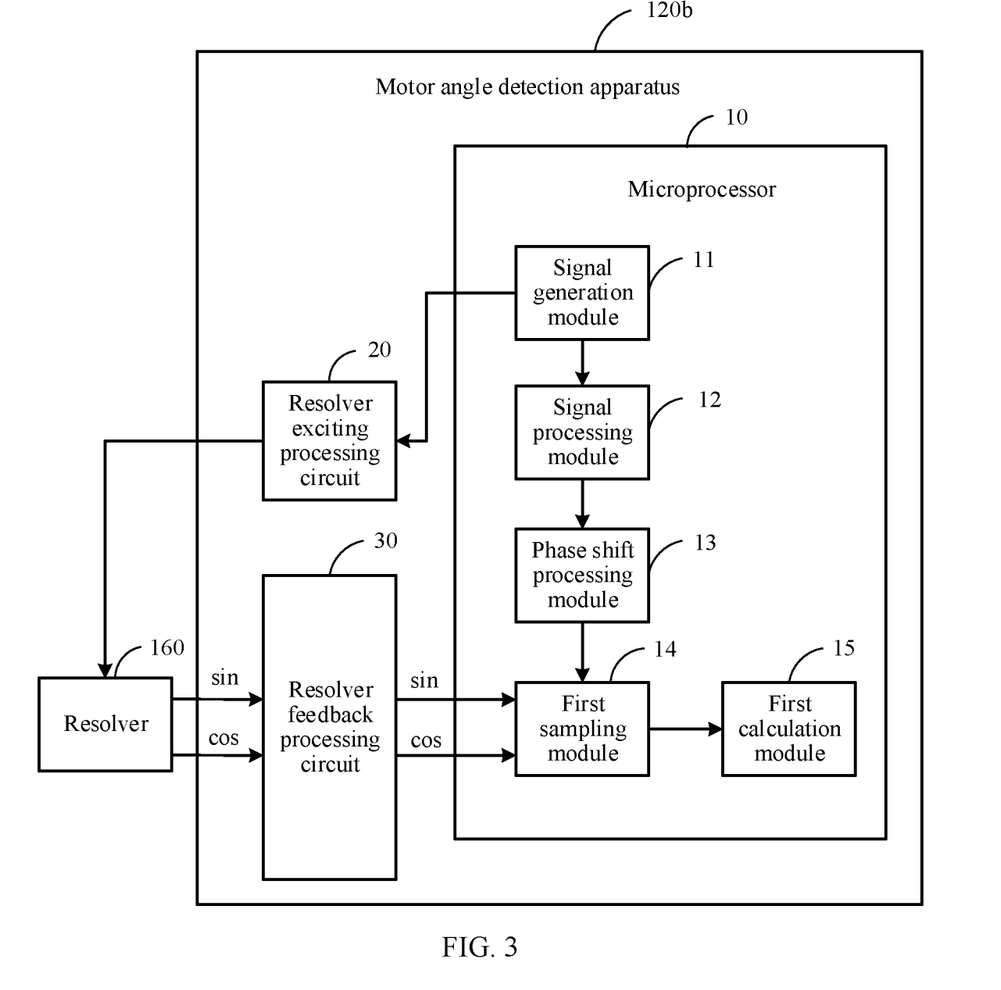
FIG. 3 is a schematic structural diagram of a motor angle detection apparatus in an embodiment of this application.

FIG. 3 is a schematic structural diagram of a motor angle detection apparatus in an embodiment of this application. As shown in FIG. 3, a motor angle detection apparatus 120b includes a microprocessor 10, a resolver exciting processing circuit 20, and a resolver feedback processing circuit 30. The resolver exciting processing circuit 20 is electrically connected between the microprocessor 10 and an input end of a resolver 160, and is configured to obtain an exciting signal after filtering and amplifying an exciting modulation signal generated by the microprocessor 10, to drive the resolver 160 to work to output a resolver feedback signal of an electrical angle of a drive motor 130. The resolver feedback processing circuit 30 is electrically connected between an output end of the resolver 160 and the microprocessor 10, and is configured to: adjust the resolver feedback signal, and send an adjusted resolver feedback signal to the microprocessor 10.

Specifically, the microprocessor 10 includes a signal generation module 11, a signal processing module 12, a phase shift processing module 13, a first sampling module 14, and a first calculation module 15. The signal generation module 11 is configured to generate the exciting modulation signal.

Figure 4:
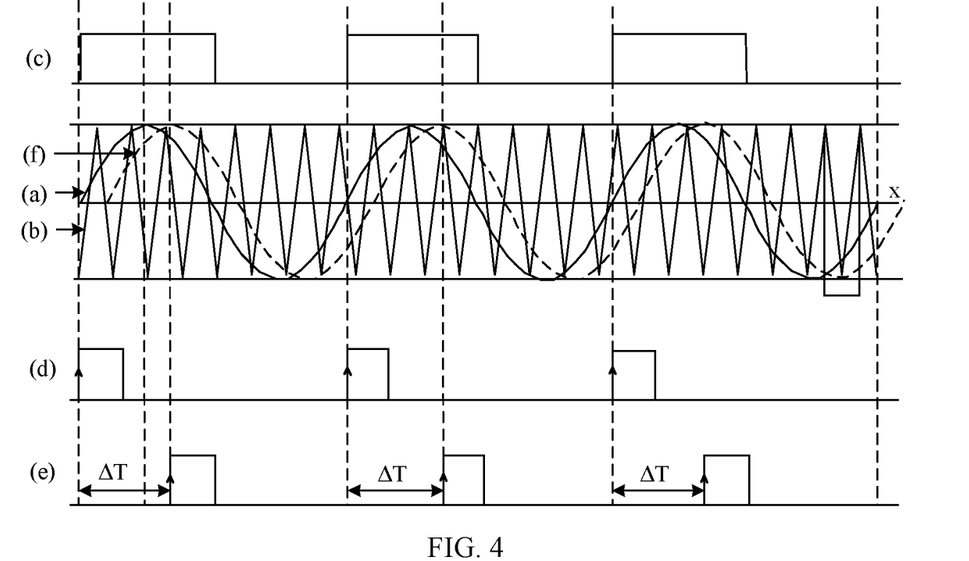
FIG. 4 is a schematic diagram of a sampling trigger signal generation process in an embodiment of this application.

Referring to FIG. 4, in some implementations, the signal generation module 11 is configured to: generate an exciting fundamental wave signal (a) and a carrier signal (b), and generate the exciting modulation signal after comparing the exciting fundamental wave signal (a) with the carrier signal (b). In the implementations, the exciting fundamental wave signal (a) is a sine wave signal, and may be obtained through table lookup. The carrier signal (b) is a symmetrical triangular wave signal, and may be implemented by using a counter. Therefore, the exciting modulation signal in this embodiment of this application is a high-frequency PWM (Pulse width modulation, Pulse width modulation) signal that includes an exciting fundamental wave component.

The signal processing module 12 is configured to determine an exciting symbol (c) based on the exciting fundamental wave signal (a). The exciting symbol (c) includes alternate high-level signals and low-level signals.

Specifically, the high-level signal corresponds to a part that is of the exciting fundamental wave signal (a) and whose voltage is greater than a reference threshold voltage x, the low-level signal corresponds to a part that is of the exciting fundamental wave signal (a) and whose voltage is less than the reference threshold voltage x, and a rising edge or a falling edge of the exciting symbol (c) corresponds to a part that is of the exciting fundamental wave signal (a) and whose voltage is equal to the reference threshold voltage x. The reference threshold voltage x is a direct current component between 0 V and 5 V, is not specifically limited, and may be determined based on a specific use case. For example, the reference threshold voltage x may be set to 3 V. In this way, a correspondence between the rising edge or the falling edge of the exciting symbol (c) and a zero crossing point of the exciting fundamental wave signal (a) can be established.

In addition, the signal processing module 12 is further configured to determine a zero crossing point signal (d) of the exciting fundamental wave signal (a) based on the exciting symbol (c). In this embodiment of this application, the signal processing module 12 determines the zero crossing point signal of the exciting fundamental wave signal (a) based on the rising edge of the exciting symbol (c).

The phase shift processing module 13 is configured to perform phase shift processing on the zero crossing point signal (d) to obtain a sampling trigger signal (e), to trigger the first sampling module 14 to sample the resolver feedback signal.

The microprocessor 10 in this embodiment of this application may determine the exciting symbol (c) based on the exciting fundamental wave signal (a) generated by the signal generation module 11, then determine the zero crossing point signal (d) of the exciting fundamental wave signal based on the exciting symbol (c), and finally perform phase shift processing on the zero crossing point signal (d) to obtain the sampling trigger signal (e), to trigger the first sampling module 14 to sample the resolver feedback signal, without using an external shaping circuit, thereby saving an area of a printed circuit board and improving an integration degree. In addition, the phase shift processing module 13 performs phase shift processing on the zero crossing point signal (d), so that the zero crossing point of the exciting fundamental wave signal (a) can be dodged, thereby avoiding abnormal sampling of the resolver feedback signal and improving sampling accuracy.

In addition, the first calculation module 15 is configured to calculate an electrical angle of the drive motor 103 based on data collected by the first sampling module 15, to decode the resolver feedback signal after the sampling.

As a specific implementation, to ensure sampling accuracy, the first sampling module 14 is a successive approximation register analog to digital converter (Successive Approximation Register ADC, SAR-ADC) with relatively high sampling accuracy. In addition, the SAR-ADC further has features such as ease of use and low power consumption, which can reduce system power consumption while facilitating integration.

It should be noted that a basic converter architecture of the SAR-ADC samples an input signal once on each conversion starting edge, performs bit comparison on each clock edge, and adjusts output of the digital to analog converter by using control logic until the output very closely matches analog input. Therefore, the basic converter architecture needs N clock cycles from an independent external clock to iteratively implement single N-bit conversion.

In some implementations, a phase shift of the sampling trigger signal (e) relative to the zero crossing point signal (d) is greater than a 90° phase shift of the exciting fundamental wave signal (a) from the zero crossing point to a peak point, and the phase shift can be set. In this way, the zero crossing point of the exciting fundamental wave signal (a) can be dodged, thereby avoiding a relatively large calculation error generated because a divisor is close to 0. In addition, the phase shift can be adjusted based on a specific use case, for ease of use by a user.

In another implementation, an absolute value of a difference between phase shift processing time of the zero crossing point signal (d) and primary reference time is less than a preset threshold. The primary reference time is time of phase shift of the exciting fundamental wave signal (a) from the zero crossing point to a peak point and delay time of passing through a resolver sampling feedback loop by the exciting fundamental wave signal (a). The delay time of the resolver sampling feedback loop is delay time needed by the exciting fundamental wave signal (a) to pass through the resolver exciting processing circuit 20, the resolver 160, and the resolver feedback processing circuit 30. In this way, the zero crossing point of the exciting fundamental wave signal (a) can be dodged, to ensure, as far as possible, that sampling is performed near the peak point of the exciting fundamental wave signal (a), thereby avoiding a relatively large calculation error generated because a divisor is close to 0, and improving sampling accuracy.

In addition, in some other implementations, the phase shift processing module 13 performs phase shift processing on the zero crossing point signal (d) to obtain a sampling trigger signal corresponding to a peak of a signal obtained after the exciting signal passes through a resolver sampling feedback loop. The signal obtained after the exciting signal passes through the resolver sampling feedback loop is shown as (f) in FIG. 4. In this way, it can be ensured that sampling is performed near a peak point of the exciting fundamental wave signal, thereby avoiding a relatively large calculation error generated because a divisor is close to 0, and improving sampling accuracy.

Figure 5:
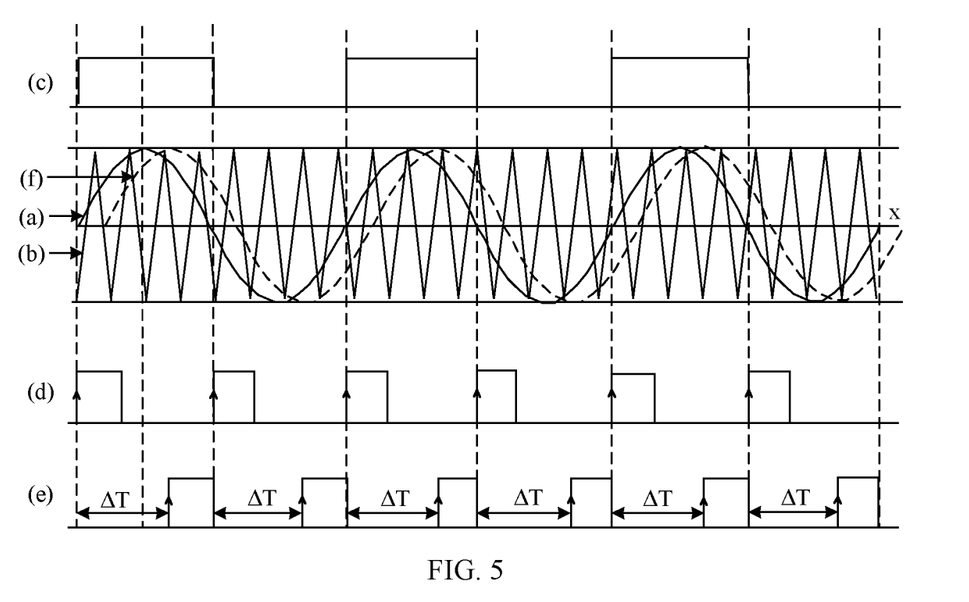
FIG. 5 is a schematic diagram of a sampling trigger signal generation process in another embodiment of this application.

Referring to FIG. 5, in another implementation, to improve sampling efficiency and sampling accuracy, the signal processing module 12 determines the zero crossing point signal of the exciting fundamental wave signal (a) based on the rising edge and the falling edge of the exciting symbol (c). That is, two times of sampling may be performed near two points of the exciting fundamental wave signal (a): a peak and a valley, so that two times of sampling trigger may be implemented in one exciting period.

As a core power component of the electric vehicle 1000, function safety of a motor controller 120 is particularly important. Torque safety is a most important function safety target of the motor controller 120, and is generally defined as no unexpected torque acceleration or deceleration, or unexpected startup. A torque function safety target ASIL (Automotive Safety Integrity Level, automotive safety integrity level) of the motor controller 120 reaches at least an ASIL C or an ASIL D. A higher ASIL indicates higher diagnosis coverage of a circuit related to function safety and a lower corresponding hardware random failure probability metric. In this embodiment of this application, description is provided by using an example that the torque function safety ASIL of the motor controller 120 is the level C.

Figure 6:
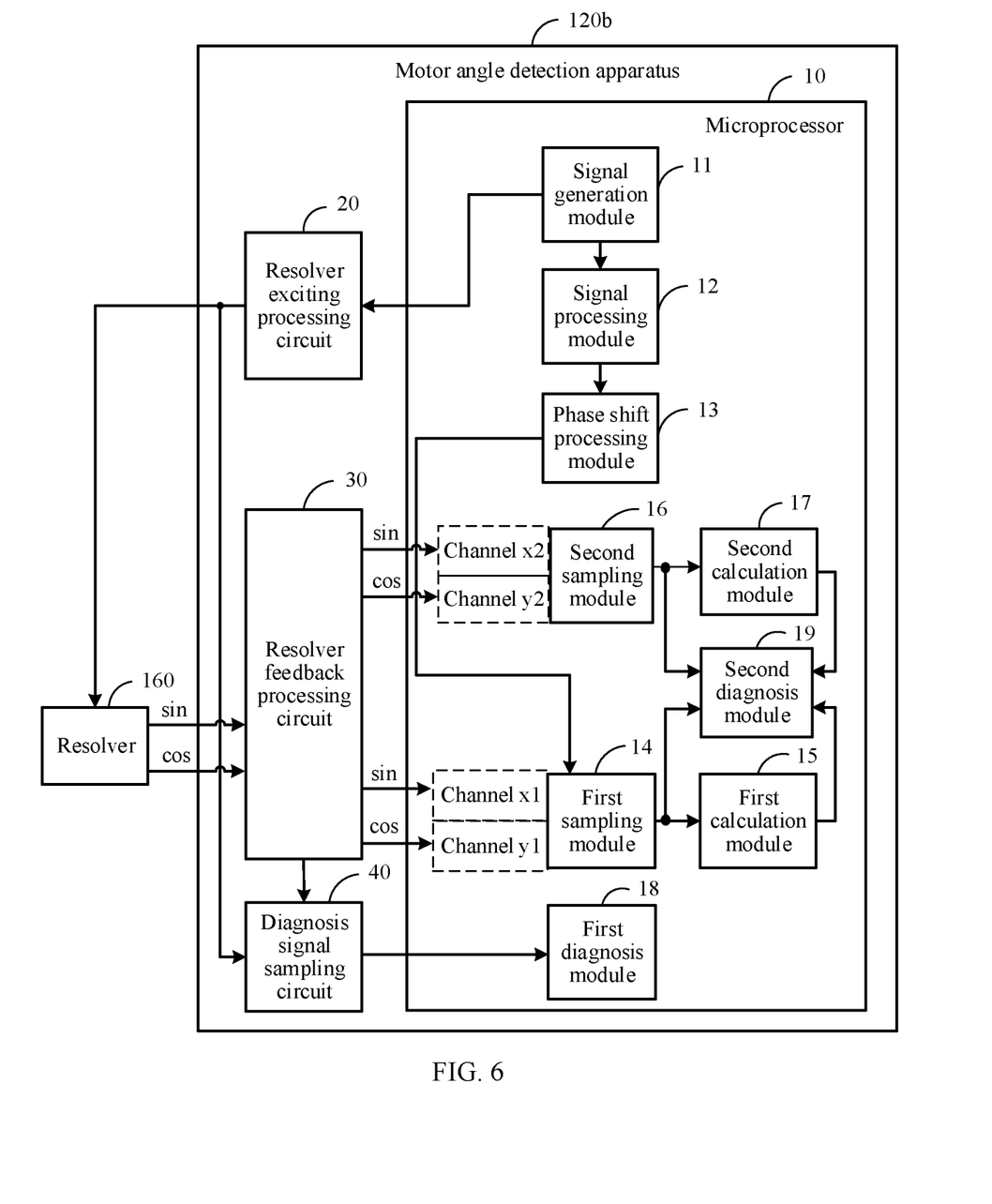
FIG. 6 is a schematic structural diagram of a motor angle detection apparatus in another embodiment of this application.

FIG. 6 is a schematic structural diagram of a motor angle detection apparatus 120b in another embodiment of this application. As shown in FIG. 6, to enable angle sampling to meet at least a function safety requirement ASIL (Automotive Safety Integrity Level) C, the motor angle detection apparatus 120b further includes a diagnosis signal sampling circuit 40. The diagnosis signal sampling circuit 40 is electrically connected to both the resolver exciting processing circuit 20 and the resolver feedback processing circuit 30, and is configured to: collect the exciting signal and the resolver feedback signal obtained after the processing by the resolver feedback processing circuit 30, and generate a corresponding loopback detection signal.

The microprocessor 10 further includes a first diagnosis module 18. The first diagnosis module 18 is configured to diagnose, based on the loopback detection signal, whether the exciting processing circuit 20 and the feedback processing circuit 30 are faulty.

The microprocessor 10 further includes a second sampling module 16, a second calculation module 17, and a second diagnosis module 19. The second sampling module 16 is configured to sample the resolver feedback signal. The second calculation module 17 is configured to calculate an electrical angle of the drive motor 130 based on data collected by the second sampling module 16. One electrical angle is used for torque control and the other electrical angle is used for torque monitoring.

The second diagnosis module 19 is configured to diagnose, in real time, data collected by the first sampling module 14 and the second sampling module 16, and is further configured to diagnose the two electrical angles in real time, so that the electrical angles meet an input quantity requirement of a torque function safety design.

It may be understood that, to use an existing design as much as possible to increase a quantity of reuse times, a system of the microprocessor 10 usually uses an EGAS three-layer architecture. A main design concept of an EGAS architecture of the motor controller is hierarchically designing a control system; in other words, dividing the control system into a function layer (Level 1), a function monitoring layer (Level 2), and a processor monitoring layer (Level 3). The function layer (Level 1) mainly implements a basic function of the control system, that is, outputs torque for the motor controller 120. The function monitoring layer (Level 2) mainly monitors the level 1, and includes a component monitoring function, an input/output variable diagnosis function, and a function of performing a system fault response after detecting a fault, for example, monitors an actual output value for torque calculation to determine whether level 1 software is correct. Once a fault is diagnosed, a system fault response is triggered and executed by the level 2. The processor monitoring layer (Level 3) mainly monitors, through question and answer, whether a processor of the level 2 is faulty, and needs to be implemented by an independent application-specific integrated circuit ASIC or microprocessor. After a fault occurs, a system fault response is triggered and executed independently of the level 1.

To meet a function safety requirement, the second sampling module 16 may be an SAR-ADC or ΣΔ analog to digital converter SD-ADC with higher sampling accuracy. Therefore, the two analog to digital converters of the level 1/level 2 may be an SD-ADC/SD-ADC, an SAR-ADC/SAR-ADC, or an SD-ADC/SAR-ADC. This embodiment of this application uses SD-ADC/SAR-ADC heterogeneous redundancy as an example for description. It should be noted that the SD-ADC includes a clock, and therefore does not need to be triggered by an external clock signal.

Figure 7:
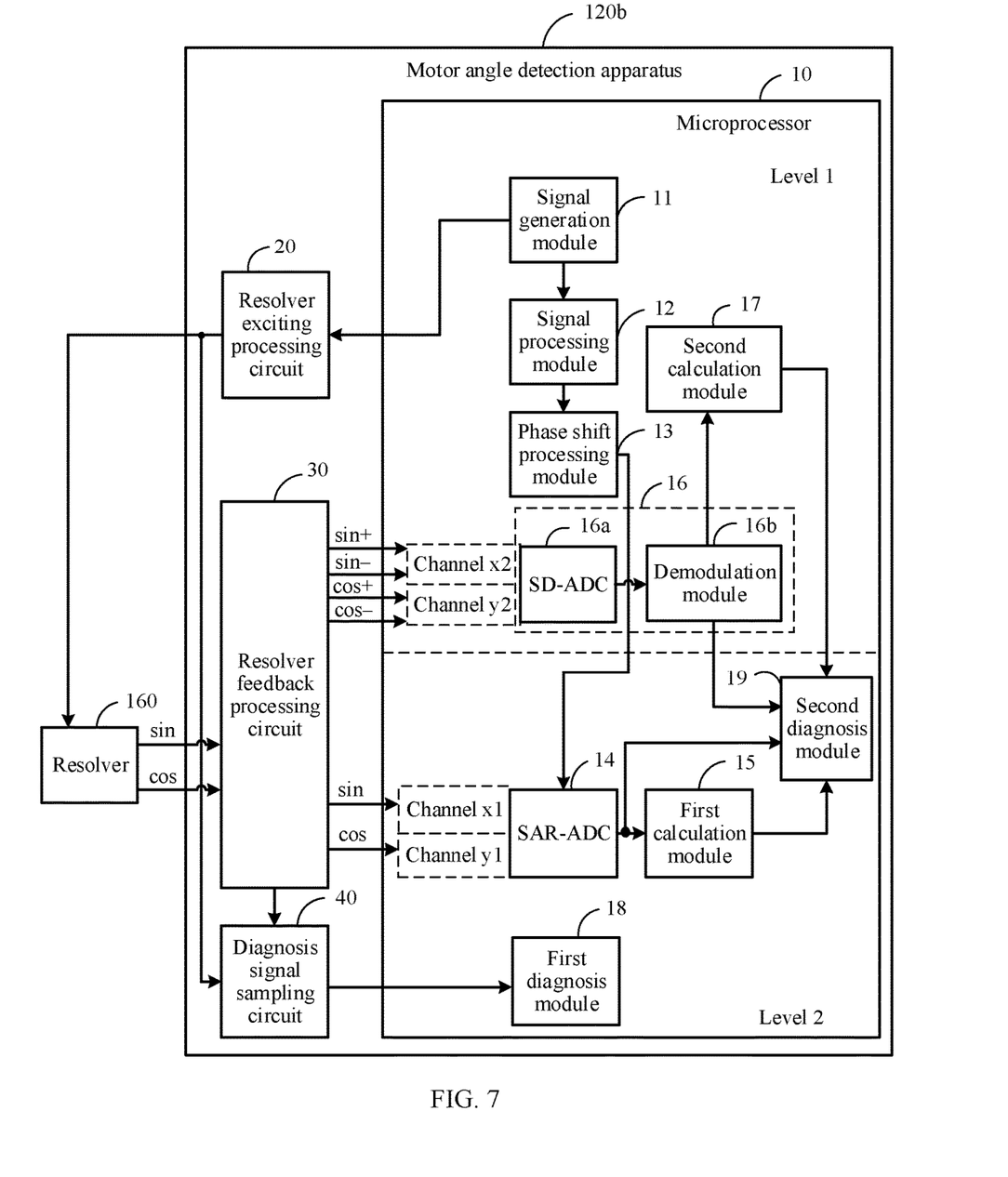
FIG. 7 is a schematic structural diagram of a motor angle detection apparatus in still another embodiment of this application.

As shown in FIG. 7, the first sampling module 14 is an SAR-ADC and is located at the level 2 layer. The second sampling module 16 is located at the level 1 layer, and includes an SD-ADC 16a and a demodulation module 16b. In addition, the signal generation module 11, the signal processing module 12, the phase shift processing module 13, and the second calculation module 17 are all located at the level 1 layer. The first calculation module 15, the first diagnosing module 18, and the second diagnosing module 19 are all located at the level 2 layer.

Specifically, the SD-ADC 16a is configured to sample the resolver feedback signal to obtain a sampled signal, and the demodulation module 16b is configured to demodulate the sampled signal to separate the exciting fundamental wave signal from the sampled signal.

The resolver feedback signal includes a sine feedback signal and a cosine feedback signal. The resolver feedback processing circuit 30 is configured to convert the sine resolver feedback signal into a sine single-ended signal and then output the sine single-ended signal to a sine sampling channel x1 of the SAR-ADC. The feedback processing circuit 30 is further configured to convert the cosine resolver feedback signal into a cosine single-ended signal and output the cosine single-ended signal to a cosine sampling channel y1 of the SAR-ADC.

The resolver feedback processing circuit 30 is further configured to convert the sine feedback signal into a sine differential signal that matches a level of an SD-ADC port, and then output the sine differential signal to a sine sampling channel x2 of the SD-ADC. The resolver feedback processing circuit 30 is further configured to convert the cosine resolver feedback signal into a cosine differential signal that matches the level of the SD-ADC port, and then output the cosine differential signal to a cosine sampling channel y2 of the SD-ADC.

Figure 8:
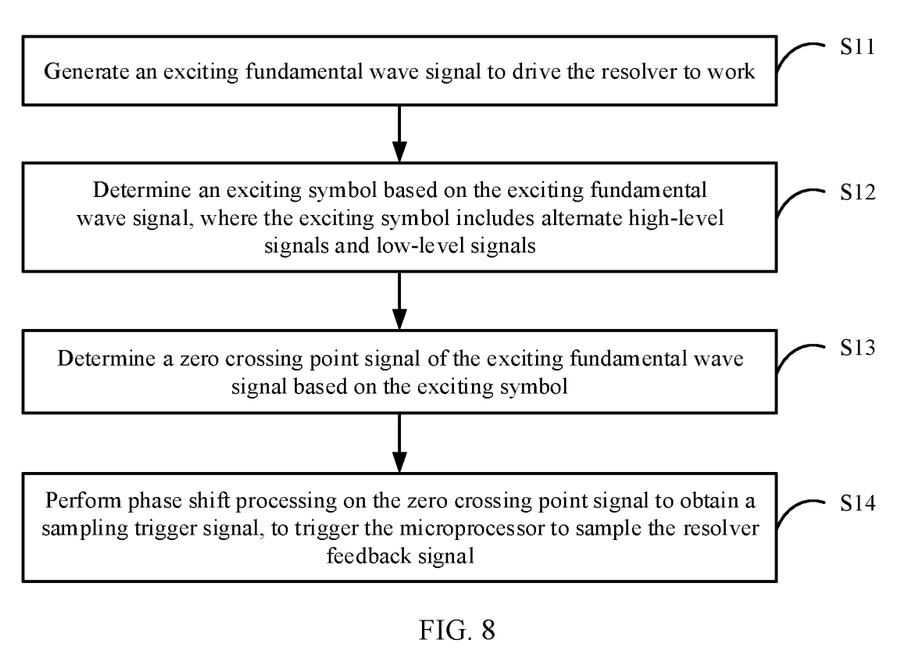
FIG. 8 is a flowchart of a sampling trigger method in an embodiment of this application.

FIG. 8 is a flowchart of a sampling trigger method in an embodiment of this application. The sampling trigger method is applied to the microprocessor 10 shown in FIG. 3, FIG. 6, or FIG. 7. The sampling trigger method includes the following step:

Step S11: Generate an exciting fundamental wave signal to drive a resolver to work.

In an implementation, the generating an exciting fundamental wave signal to drive the resolver to work includes: further generating a carrier signal while generating the exciting fundamental wave signal, and comparing the exciting fundamental wave signal with the carrier signal to generate an exciting modulation signal, where an exciting signal is obtained after the exciting modulation signal is filtered and amplified, to drive the resolver to work.

Step S12: Determine an exciting symbol based on the exciting fundamental wave signal, where the exciting symbol includes alternate high-level signals and low-level signals.

Specifically, the high-level signal corresponds to a part that is of the exciting fundamental wave signal and whose voltage is greater than a reference threshold voltage, the low-level signal corresponds to a part that is of the exciting fundamental wave signal and whose voltage is less than the reference threshold voltage, and a rising edge or a falling edge of the exciting symbol corresponds to a part that is of the exciting fundamental wave signal and whose voltage is equal to the reference threshold voltage. The reference threshold voltage is a direct current component between 0 V and 5 V.

Step S13: Determine a zero crossing point signal of the exciting fundamental wave signal based on the exciting symbol.

In this implementation, the determining a zero crossing point signal of the exciting fundamental wave signal based on the exciting symbol includes: determining the zero crossing point signal of the exciting fundamental wave signal based on the rising edge and/or the falling edge of the exciting symbol.

Step S14: Perform phase shift processing on the zero crossing point signal to obtain a sampling trigger signal, to trigger a first analog to digital conversion module to sample a resolver feedback signal.

In an implementation, a phase shift of the sampling trigger signal relative to the zero crossing point signal is greater than a 90° phase shift of the exciting fundamental wave signal from a zero crossing point to a peak point, and the phase shift can be set.

In another implementation, an absolute value of a difference between phase shift processing time of the zero crossing point signal and primary reference time is less than a preset threshold, and the primary reference time is time of phase shift of the exciting fundamental wave signal from a zero crossing point to a peak point and delay time of passing through a resolver sampling feedback loop by the exciting fundamental wave signal.

In still another implementation, the performing phase shift processing on the zero crossing point signal to obtain a sampling trigger signal includes: performing phase shift processing on the zero crossing point signal to obtain a sampling trigger signal corresponding to a peak and/or a valley of a signal obtained after the exciting signal passes through a resolver sampling feedback loop.

Figure 9:
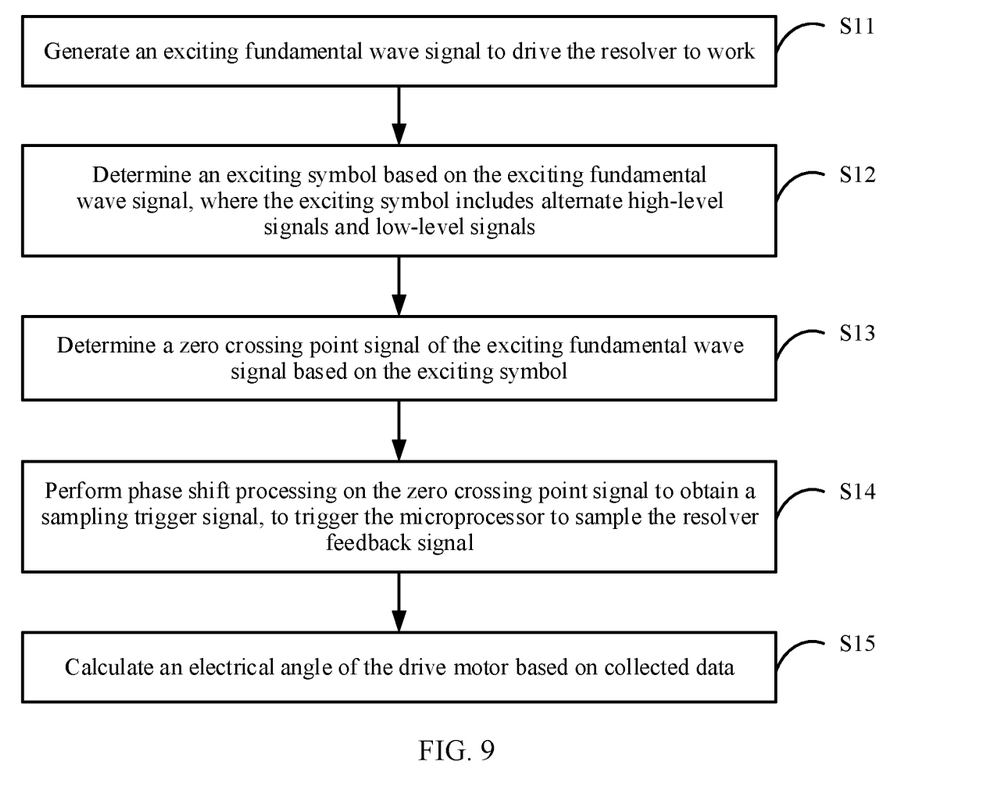
FIG. 9 is a flowchart of a sampling trigger method in another embodiment of this application.

FIG. 9 is a flowchart of a sampling trigger method in another embodiment of this application. Different from that in FIG. 8, after the sampling, the sampling trigger method further includes the following step:

Step S15: Calculate an electrical angle of a drive motor based on collected data.

In this way, software decoding of the resolver feedback signal can be implemented.

It may be clearly understood by a person skilled in the art that, for the purpose of convenient and brief description, for a specific process of the foregoing steps, refer to a working process corresponding to a module in the foregoing apparatus embodiment. Details are not described herein again.

It should be noted that, for brief description, the foregoing method embodiments are represented as a series of actions. However, a person skilled in the art should appreciate that this application is not limited to the described order of the actions, because according to this application, some steps may be performed in other orders or simultaneously.

In the foregoing embodiments, the descriptions of the embodiments have respective focuses. For a part that is not described in detail in an embodiment, refer to related descriptions in other embodiments.

A sequence of the steps of the method in the embodiments of this application may be adjusted, combined, or removed based on an actual requirement.

The implementations of this application may be randomly combined to implement different technical effects.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedures or functions according to this application are completely or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a web site, computer, server, or data center to another web site, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a Solid State Disk), or the like.

The foregoing descriptions are only embodiments of the technical solutions of the present disclosure, but are not intended to limit the protection scope of the present disclosure. Any modification, equivalent replacement, improvement, or the like made according to the present disclosure shall fall within the protection scope of the present disclosure. For example, techniques, systems, subsystems, and methods described and illustrated in the various embodiments as discrete or separate may be combined or integrated with other systems, modules, techniques, or methods without departing from the scope of the present disclosure. Other items shown or discussed as connected or coupled or directly coupled or communicating with each other may be indirectly connected, coupled, or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A sampling trigger method applied to a microprocessor, wherein the microprocessor is coupled to a resolver and a drive motor and the microprocessor samples a resolver feedback signal related to an electrical angle of the drive motor, the resolver feedback signal being output by the resolver, the sampling trigger method comprising:
generating an exciting fundamental wave signal to drive the resolver;
determining an exciting symbol based on the exciting fundamental wave signal, wherein the exciting symbol consists of alternate high-level signals and low-level signals;
determining a zero-crossing point signal of the exciting fundamental wave signal based on the exciting symbol;
performing phase shift processing on the zero-crossing point signal to obtain a resolver feedback signal, an absolute value of a difference between a phase shift processing time of the zero-crossing point signal and a primary reference time is less than a preset threshold, and the primary reference time is a time of a phase shift of the exciting fundamental wave signal from a zero-crossing point to a peak point and a delay time of passing through a resolver sampling feedback loop by the exciting fundamental wave signal; and
sampling the resolver feedback signal.

2. The sampling trigger method according to claim 1, wherein the microprocessor comprises a first sampling module, and the first sampling module is a successive approximation register analog to digital converter SAR-ADC; and the triggering the microprocessor to sample the resolver feedback signal comprises: triggering the SAR-ADC to sample the resolver feedback signal.

3. The sampling trigger method according to claim 1, wherein the high-level signal corresponds to a part that is of the exciting fundamental wave signal and whose voltage is greater than a reference threshold voltage, the low-level signal corresponds to a part that is of the exciting fundamental wave signal and whose voltage is less than the reference threshold voltage, and a rising edge or a falling edge of the exciting symbol corresponds to a part that is of the exciting fundamental wave signal and whose voltage is equal to the reference threshold voltage.

4. The sampling trigger method according to claim 3, wherein the determining the zero crossing point signal of the exciting fundamental wave signal based on the exciting symbol comprises: determining the zero crossing point signal of the exciting fundamental wave signal based on the rising edge and/or the falling edge of the exciting symbol.

5. The sampling trigger method according to claim 1, wherein a phase shift of a sampling trigger signal relative to the zero-crossing point signal is greater than a 90° phase shift of the exciting fundamental wave signal from the zero-crossing point to a peak point, and the phase shift can be adjusted.

6. The sampling trigger method according to claim 1, wherein the generating the exciting fundamental wave signal to drive the resolver to work comprises: further generating a carrier signal while generating the exciting fundamental wave signal, and comparing the exciting fundamental wave signal with the carrier signal to generate an exciting modulation signal, wherein an exciting signal is obtained after the exciting modulation signal is filtered and amplified, to drive the resolver to work; and the performing the phase shift processing on the zero-crossing point signal comprises: performing the phase shift processing on the zero-crossing point signal to obtain a sampling trigger signal corresponding to a peak and/or a valley of a signal obtained after the exciting signal passes through the resolver sampling feedback loop.

7. The sampling trigger method according to claim 1, wherein after the triggering the microprocessor to sample the resolver feedback signal, the sampling trigger method further comprises:

calculating the electrical angle of the drive motor based on collected data.

8. A microprocessor connected to a drive motor by a resolver, and configured to sample a resolver feedback signal of an electrical angle of the drive motor and that is output by the resolver, the microprocessor comprising:

a signal generation module configured to generate an exciting fundamental wave signal to drive the resolver to work;

a signal processing module configured to:
  determine an exciting symbol based on the exciting fundamental wave signal, the exciting symbol comprising alternate high-level signals and low-level signals; and
  determine a zero-crossing point signal of the exciting fundamental wave signal based on the exciting symbol; and a phase shift processing module configured to perform phase shift processing on the zero-crossing point signal to obtain a sampling trigger signal, to trigger the microprocessor to sample the resolver feedback signal, an absolute value of a difference between a phase shift processing time of the zero-crossing point signal and a primary reference time is less than a preset threshold, and the primary reference time is a time of a phase shift of the exciting fundamental wave signal from a zero-crossing point to a peak point and a delay time of passing through a resolver sampling feedback loop by the exciting fundamental wave signal.

9. The microprocessor according to claim 8, wherein the microprocessor comprises a successive approximation register analog to digital converter SAR-ADC; and the phase shift processing module is configured to perform phase shift processing on the zero-crossing point signal to obtain the sampling trigger signal, to trigger the SAR-ADC to sample the resolver feedback signal.

10. The microprocessor according to claim 8, wherein the high-level signal corresponds to a part that is of the exciting fundamental wave signal and whose voltage is greater than a reference threshold voltage, the low-level signal corresponds to a part that is of the exciting fundamental wave signal and whose voltage is less than the reference threshold voltage, and a rising edge or a falling edge of the exciting symbol corresponds to a part that is of the exciting fundamental wave signal and whose voltage is equal to the reference threshold voltage.

11. The microprocessor according to claim 10, wherein the signal processing module is configured to determine the zero-crossing point signal of the exciting fundamental wave signal based on the rising edge and/or the falling edge of the exciting symbol.

12. The microprocessor according to claim 8, wherein a phase shift of the sampling trigger signal relative to the zero-crossing point signal is greater than a 90° phase shift of the exciting fundamental wave signal from a zero-crossing point to a peak point, and the phase shift can be set.

13. The microprocessor according to claim 8, wherein the signal generation module is further configured to: generate a carrier signal, and compare the exciting fundamental wave signal with the carrier signal to generate an exciting modulation signal, wherein an exciting signal is obtained after the exciting modulation signal is filtered and amplified, to drive the resolver to work; and the phase shift processing module is configured to perform the phase shift processing on the zero-crossing point signal to obtain the sampling trigger signal corresponding to a peak and/or a valley of a signal obtained after the exciting signal passes through a resolver sampling feedback loop.

14. The microprocessor according to claim 8, wherein the microprocessor further comprises a first calculation module configured to calculate the electrical angle of the drive motor based on collected data.

15. A motor controller, comprising:

an inverter circuit, wherein an input end of the inverter circuit is connected to a power battery, and an output end of the inverter circuit is connected to a drive motor; the inverter circuit is configured to convert a high-voltage direct current output by the power battery into an alternating current to enable the drive motor to work;

a diagnosis signal sampling circuit, the diagnosis signal sampling circuit is electrically connected to both the resolver exciting processing circuit and the resolver feedback processing circuit, and is configured to:
  collect an exciting signal and a resolver feedback signal obtained after processing by the resolver feedback processing circuit; and
  generate a corresponding loopback detection signal; and a microprocessor coupled to the drive motor using a resolver, the microprocessor comprising:

a signal generation module configured to generate an exciting fundamental wave signal to drive the resolver to work;

a signal processing module configured to determine an exciting symbol based on the exciting fundamental wave signal, the exciting symbol comprising alternate high-level signals and low-level signals, and the signal processing module is further configured to determine a zero-crossing point signal of the exciting fundamental wave signal based on the exciting symbol;

a phase shift processing module configured to perform phase shift processing on the zero-crossing point signal to obtain a sampling trigger signal, to trigger the microprocessor to sample the resolver feedback signal;

a first diagnosis module configured to diagnose, based on the loopback detection signal, whether the resolver exciting processing circuit and the resolver feedback processing circuit are faulty; and, a second sampling module configured to sample the resolver feedback signal;

a second calculation module configured to calculate an electrical angle of the drive motor based on data collected by the second sampling module, one electrical angle being used for torque control, and the other electrical angle being used for torque monitoring; and a second diagnosis module configured to diagnose, in real time, data collected by a first sampling module and the second sampling module, and is further configured to diagnose the two electrical angles in real time so that the electrical angles meet an input quantity requirement of a torque function safety design.

16. The motor controller according to claim 15, wherein the motor controller further comprises a resolver exciting processing circuit and a resolver feedback processing circuit; the resolver exciting processing circuit is electrically connected between the microprocessor and the resolver, and is configured to filter and amplify an exciting modulation signal; and the resolver feedback processing circuit is connected between the resolver and the microprocessor, and is configured to convert a resolver feedback signal into a single-ended signal.

17. The motor controller of claim 15, where the controller is embodied in an electronic vehicle.

* * * * *